United States Patent [19]

Gagon

[11] Patent Number: 5,510,752
[45] Date of Patent: Apr. 23, 1996

[54] LOW INPUT SIGNAL BANDWIDTH COMPRESSOR AND AMPLIFIER CONTROL CIRCUIT

[75] Inventor: Paul R. Gagon, Garden Grove, Calif.

[73] Assignee: BBE Sound Inc., Huntington Beach, Calif.

[21] Appl. No.: 377,903

[22] Filed: Jan. 24, 1995

[51] Int. Cl.$^6$ ............................. H03F 3/68; H03F 17/00
[52] U.S. Cl. ............................. 330/126; 381/106; 330/59
[58] Field of Search ............................. 330/59, 126, 303, 330/305, 306; 333/14; 381/106

[56] References Cited

U.S. PATENT DOCUMENTS

| | | | |
|---|---|---|---|
| 3,714,462 | 1/1973 | Blackmer | 307/229 |
| 3,789,143 | 6/1974 | Blackmer | 179/15.55 R |
| 4,097,767 | 6/1978 | Blackmer | 307/229 |
| 4,327,331 | 4/1982 | Yoshimi et al. | 330/126 |
| 4,403,199 | 9/1983 | Blackmer | 330/278 |
| 4,409,500 | 10/1983 | Welland | 307/490 |
| 4,482,866 | 11/1984 | Crooks | 330/149 |
| 4,484,345 | 11/1984 | Stearns | 381/98 |
| 4,638,258 | 1/1987 | Crooks | 330/149 |
| 4,661,851 | 4/1987 | Muterspaugh | 381/106 |

OTHER PUBLICATIONS

Model 563X Hiss Reducer dbx Service Manual Including a Schematic 563X Main Led Board, 340654 Dated Nov. 5, 1987.

*Primary Examiner*—Steven Mottola
*Attorney, Agent, or Firm*—Foley & Lardner

[57] ABSTRACT

An amplifier circuit having a pre-amplifier responsive to a program input signal, a filter circuit, and an absolute value circuit. The pre-amplifier provides automated balancing between the high frequency channel signals and the mid range channel signals to provide a compensated signal. The filter circuit is coupled to receive and automatically filter the compensated signal to provide an output signal and a modified compensated signal. The filter circuit has an adjustable bandwidth that is automatically adjusted in response to the control signal for automatically reducing the bandwidth of the filter circuit in response to lower values of the control signal to obtain the output signal. The filter circuit uses a voltage controlled amplifier or a photo cell in combination with an integrator. An absolute value circuit senses the modified compensated signal and provides a control signal proportional to the average peak value of the amplitude of the modified compensated signal.

15 Claims, 3 Drawing Sheets

LOW INPUT SIGNAL BANDWIDTH COMPRESSOR AND AMPLIFIER CONTROL CIRCUIT

BACKGROUND OF THE INVENTION

1. Field of the Invention

This invention relates to the field of electronics amplifiers and more particularly to the field of signal conditioning circuits for signal compression and expansion such as those used in audio entertainment systems.

As an example of signal compression, the magnetic tape on a tape deck might have a dynamic range of only about 60 Db. A signal source might be supplying the tape with a signal that has a dynamic range of about 80 Db. If the signal level of the source material is adjusted such that the largest signals are not clipped, the resulting recording would have passages that are very soft and possibly inaudible when reproduced. To hear the softer passages when replayed at a later time, the output level would have to be increased to a level that might begin to reproduce the noise floor of the recording media on the tape.

A compressor circuit is used to compress the 80 dB source signal range into about 40 Db by attenuating the larger amplitude signals and not the lower amplitude signals. The signal source output signal amplitude is then adjusted to place the topmost value of the 40 dB signal range out of the signal source at a level that matches the top value of the 60 dB signal range of the tape in the recorder. The signal range on the tape is thereby positioned at levels between the top limit of the dynamic range of the tape, absent clipping, down 40 dB leaving a remaining 20 dB of signal dynamic range that contains noise but which is largely absent signal information.

The large amplitude low frequency signals are compressed in amplitude along with bursts or instantaneous transients that are typically high frequency information. A compressor appears to function to attenuate only the larger amplitude signals leaving the lower amplitude signals unaffected. The larger the range of change, the larger the attenuation.

This invention combines a multichannel pre-amplifier with automatic balancing on the mid-range and high frequency channels with automated bandwidth expansion and compression as a function of signal amplitude. The invention therefore functions as a simplified compander in providing the features of both a compressor and an expander in the same topology.

2. Description of Related Art

U.S. Pat. No. 3,789,143 issued Jan. 29, 1974 to D. E. Blackmeer teaches a "Compander With Control Signal Logarithmically Related To The Instantaneous RMS Value Of The Input Signal" that shows a circuit in which the gain control is derived proportional to the RMS value of the audio signal that is received at its input. This circuit topology does not appear to contain a bandwidth sensitive feature that reduces the bandwidth of the amplifier in response to receiving signals of lower amplitude nor does it show the circuit in combination with appropriate pre-amplification characterized to provide an automatic balance between the amplitude of the midrange and high frequency ranges of signals being processed by the pre-amplifier.

U.S. Pat. No. 4,482,866 issued on Nov. 13, 1984 for a Reference Load Amplifier Correction System, and U.S. Pat. No. 4,638,258 issued on Jan. 20, 1987 for a Reference Load Amplifier Correction System, both issuing to Robert C. Crooks. Both of these patents have a common assignee Barcus-Berry Electronics, Inc. of Huntington Beach, Calif. now owned by BBE Sound, also of Huntington Beach, Calif., the assignee of this application. The '866' patent and the '258' patent show circuit topologies that can be used as the pre-amplifier section of the claimed combination invention; however, the arrangement of FIGS. 8 and 9 in the '258' patent is preferred. None of the aforementioned references show or teach the claimed elements of a filter channel or the absolute value circuit in combination with the pre-amplifier.

A first object of the invention is to provide an amplifier circuit that has: a pre-amplifier with automatic gain control circuitry for balancing the high and mid range signal components to provide a compensated signal. The compensated signal is coupled to a first channel.

The first channel is a filter circuit that is coupled to receive the compensated signal, and a control signal. The filter circuit provides a modified compensated signal, and an output signal. The bandwidth of the filter circuit is adjusted automatically by the control signal. As the amplitude of the control signal is reduced, the bandwidth of the filter circuit is reduced.

The second channel is an absolute value circuit that responds to the modified compensated signal and provides a control signal proportional to the amplitude of the modified compensated signal.

A second object of the invention is to provide a pre-amplifier that has a high frequency correction channel, a low frequency correction channel, a mid range channel, an automatic adjusting means and a summing circuit.

The high frequency correction channel, the low frequency correction channel and the mid range channel each receive the input signal referred to as a program signal from a source such as a record or tape player.

The high frequency correction channel provides a high frequency compensated signal; the low frequency correction channel provides a low frequency compensated signal and the mid range channel provides a mid range signal. The automatic adjusting means for automatically adjusts the balance between the high frequency compensated signal and the mid range signal. The summing circuit adds the high frequency compensated signal, the low frequency compensated signal and the mid range signal to provide the compensated signal. In a preferred embodiment, the mid range channel has an inverting amplifier.

It is a second object of the invention to provide an embodiment of the absolute value circuit that has a high pass amplifier coupled to receive the modified compensated signal from the filter circuit. The high pass amplifier amplifies the modified compensated signal couples its output, a first amplified signal to the input of an absolute value rectifier circuit. The absolute value rectifier circuit rectifies the first amplified signal and provides an absolute value signal. A peak detection circuit receives the absolute value signal and provides a peaked absolute value signal. A low-pass filter and bias circuit receives the peak absolute value signal and provides the control signal to the filter channel. The low-pass filter and bias circuit has a dc bias adjustment control for adding a dc bias level to the control signal.

It is a third object of the invention to provide an embodiment of the filter circuit that has an input amplifier for summing the compensated signal and an integrator output signal and that provides the modified compensated signal to the input of the absolute value circuit and to the input of a voltage controlled amplifier. The voltage control amplifier has a second input coupled to receive the control voltage. The voltage control amplifier provides an integrator input signal current to the input of an integrator circuit.

The integrator circuit integrates the integrator input signal current and provides an integrator output signal. A low-pass active filter receives the integrator output signal and filters it to provide the output signal.

In another alternative embodiment of the filter circuit, the input amplifier for summing the compensated signal and the integrator output signal provides the modified compensated signal to a photocell that has a photosensitive resistor and a light emitting diode driven by the control signal from the output of the absolute value circuit. The photosensitive resistor responds to light from the light emitting diode to modify the modified compensated signal to be an integrator input signal. The photosensitive resistor couples the integrator input signal to the integrator input.

PREFERRED EMBODIMENT

Figure 1:
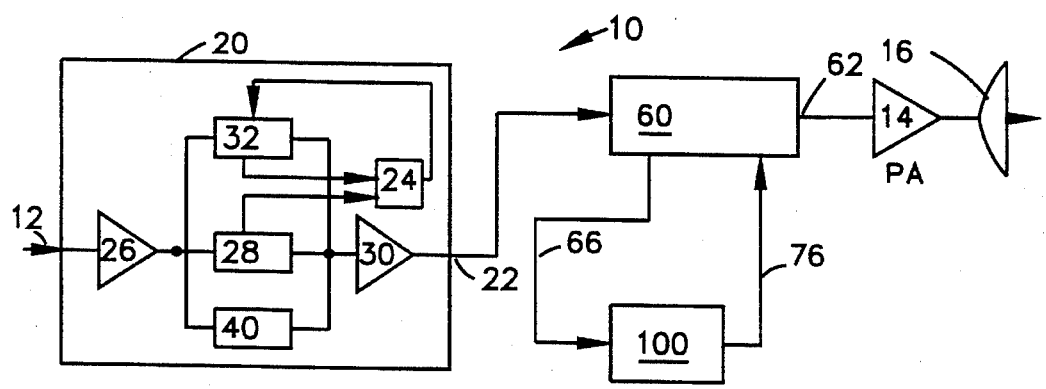
FIG. 1. is a block diagram of the amplifier circuit showing a three channel pre-amplifier with automatic gain control circuitry for balancing the high and mid range signal components, in combination with the filter circuit and the absolute value circuit.

FIG. 1 is a block diagram of the invention amplifier circuit 10 coupled to receive a program input signal such as the low level audio signal from a tape recorder or tape deck or the composite analog signal after a digital-to-analog conversion from a digital signal source (not shown) at input terminal 12. The amplifier is typically used to provide a conditioned output signal to a power amplifier 14 which provides a drive signal to a speaker 16.

The invention amplifier has a pre-amplifier 20, a filter circuit 60 and an absolute value circuit 100, the individual functions and features of which will now be explained in connection with the block diagram of FIG. 1 and the subsequent detailed schematics of FIGS. 2–5.

Block 20 represents a pre-amplifier responsive to the program input signal at terminal 12 which signal is typically a continuously varying composite signal having high, low and mid range frequency signal components in the 30 Hz to 20 KHz range. The pre-amplifier 20, as shown in FIG. 1 and in greater detail in FIG. 2, is typically a three channel amplifier that provides a highly compensated signal at the pre-amplifier output terminal 22.

The pre-amplifier necessary for combination with the filter circuit 60 and absolute value circuit 100 has automatic gain control circuitry represented by block 24 in FIG. 1. The automatic gain control circuitry represented by block 24 in FIG. 1 is shown in substantial detail within phantom block 24 in FIG. 2. Features of the automatic gain control circuitry and the advantages of this control feature are explained in U.S. Pat. No. 4,482,866 at column 23, line 30 and those lines and columns subsequent.

U.S. Pat. No. 4,482,866 issued on Nov. 13, 1984 for a Reference Load Amplifier Correction System, and U.S. Pat. No. 4,638,258 issued on Jan. 20, 1987 for a Reference Load Amplifier Correction System are incorporated herein by reference in their entirety.

Figure 2:
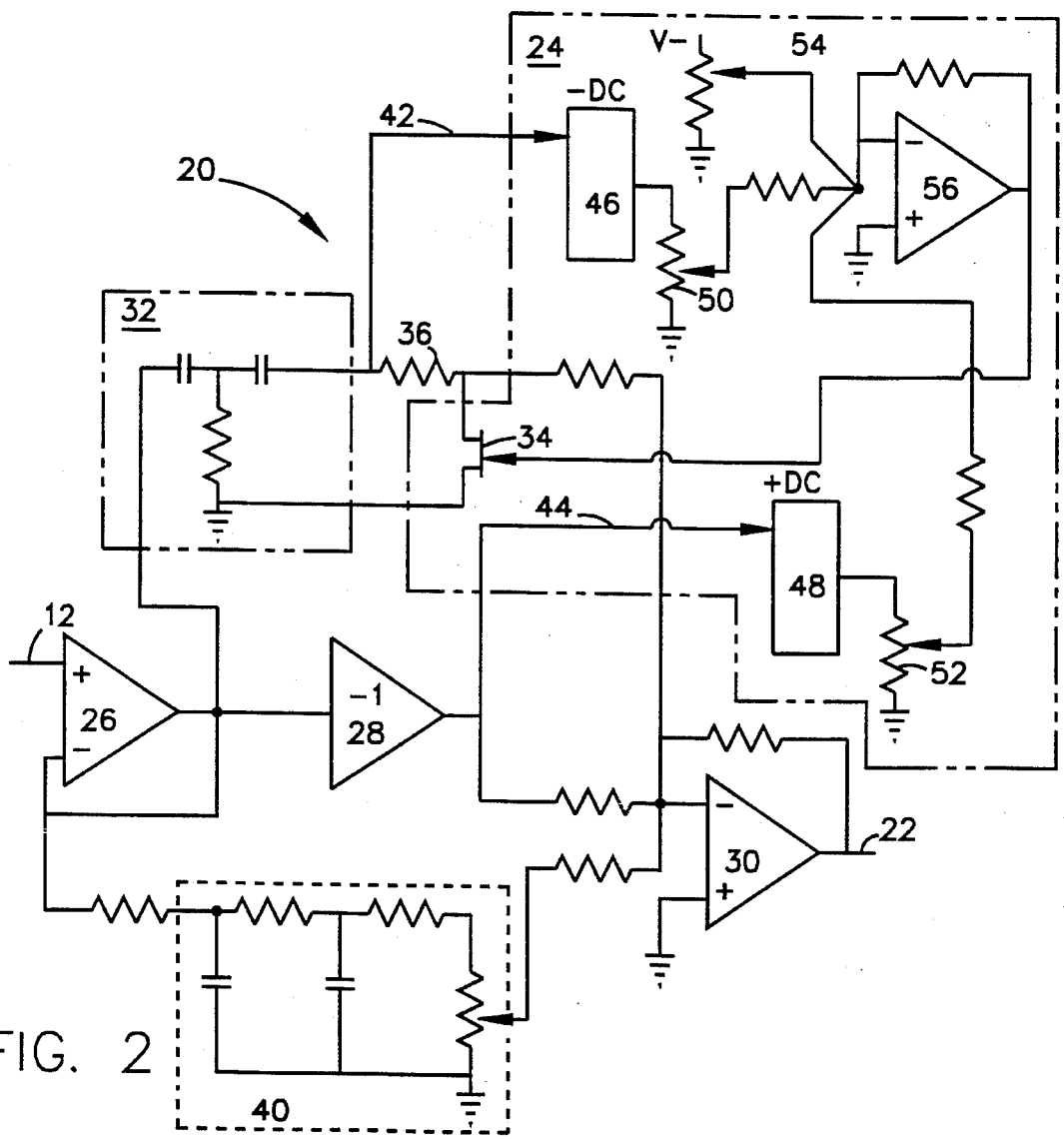
FIG. 2 is a detailed schematic showing the three channel pre-amplifier with automatic gain control circuitry for balancing the high and mid range signal components.

Referring to FIG. 2, the pre-amplifier input amplifier 26 provides impedance matching and buffering to and from the input source. The inverting amplifier 28, shown as having unity gain receives the buffered input signal from the output of the input amplifier 26 and provides an inverted mid range signal to an input of summing amplifier 30.

The input amplifier 26 also provides the buffered input signal to a high pass channel represented by the passive filter circuitry within phantom block 32. The output of the high pass filter provides its output to the divider formed by resistor 36 and by J-FET 34, the gate of the J-FET being controlled by the automatic gain control circuitry represented by block 24. The automatic gain control circuitry balances the high frequency signal components in the 2,500–20,000 range processed by the circuitry of phantom block 32 with the mid range frequency components in the 200–2,500 range being output by inverting amplifier 28.

Phantom block 40 contains a two pole passive network comprising a the low pass channel for processing signal components in the 30–200 Hz range.

The automatic gain control circuitry within phantom block 24 senses the high frequency signal components on signal line 42 from the output of the high frequency channel and the mid range signal components on signal line 44 form the output of the mid range inverting amplifier 28. The high frequency channel signal components are delivered to a negative output absolute circuit 46 that provides a negative going output control signal for increasing amplitudes of the sampled high frequency signal components. The mid range channel mid range signal components are delivered to a positive output absolute circuit 48 that provides a positive going output control signal for increasing amplitudes of the sampled mid range frequency signal components.

The negative going output control signal is adjusted by divider 50; the positive going output control signal is adjusted by divider 52 and the combined control signals are balanced by balance adjustment 54 as they are summed by control summing amplifier 56 to provide a gate control signal to the gate of J-FET 34 to reduce or increase the amplitude of the high frequency channel signal components to keep them in balance with the amplitude of the mid range channel frequency components. Pre-amplifier summing amplifier 30 sums the balanced high and mid range frequency signal components with the low frequency signal components to provide the compensated signal at terminal 22.

Figure 3:
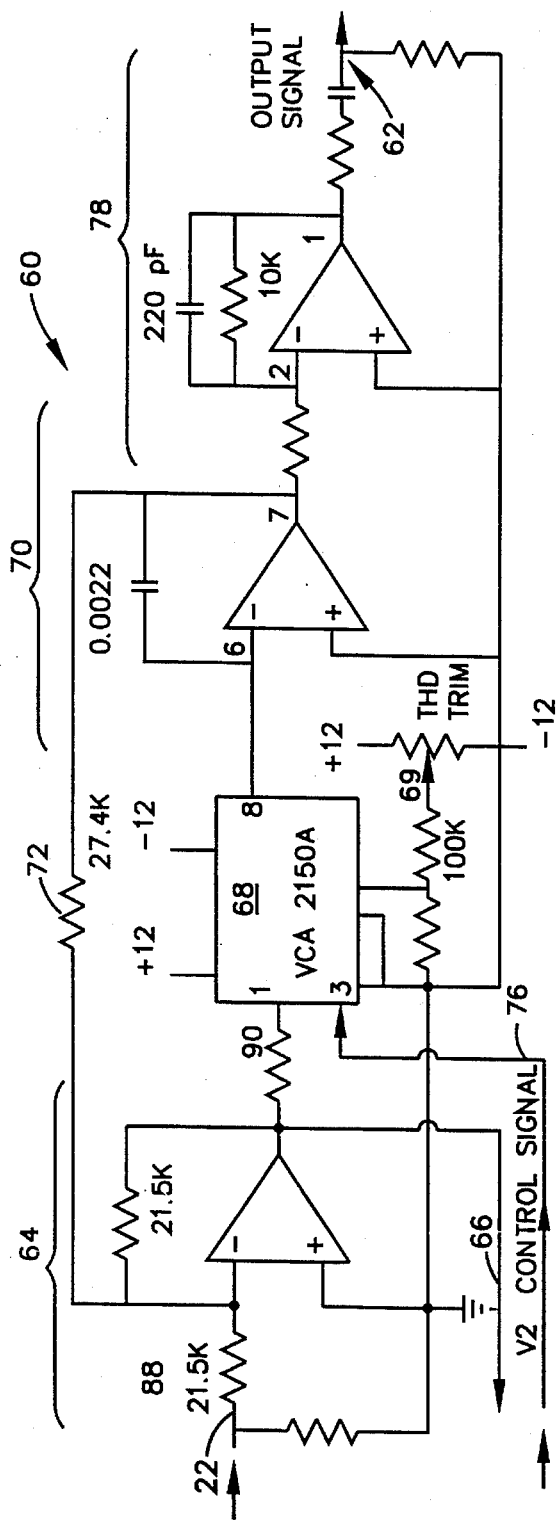
FIG. 3 is a schematic of a first embodiment of a single stage filter circuit responsive to a compensated signal from the pre-amplifier, the single stage filter circuit using a solid state voltage controlled amplifier responsive to a control signal for providing an output signal.

FIG. 3 shows an embodiment of the filter circuit 60. The filter circuit is coupled to receive and automatically filter the compensated signal at terminal 22 to provide an output signal at terminal 62. A modified compensated signal is provided by filter input amplifier 64 on signal line 66 to the input of absolute value circuit 100 shown in FIG. 5.

The output impedance of the filter input amplifier 64 is sufficiently low that it is able to also provide the modified compensated signal to the input of voltage controlled amplifier 68. The filter input amplifier 64 also receives a feedback signal from the output of integrator 70 via input resistor 72. It should be understood that the feedback signal from the integrator vary slowly in comparison with the compensated signal at terminal 22. Therefore, the modified compensated signal necessary for the absolute value channel could be obtained from a separate filter input amplifier (not shown) at the input of the absolute value circuit, the added filter input amplifier circuit being coupled to receive the compensated signal directly from terminal 22.

If a separate filter input amplifier (not shown) were to be used, the feedback control signal from resistor 72 would probably be omitted. If the separate filter input amplifier were to be used, FIG. 1 would be modified to use the signal path of phantom line 74 while deleting the signal path of signal line 66.

However, the topology shown in FIG. 3 is believed to be preferred since it operates satisfactorily and requires one less amplifier the alternative arrangement being a design alternative.

In the embodiment of FIG. 3, the voltage controlled amplifier 68 is typically a 2150A voltage controlled amplifier obtained from the THAT Corporation, dbx OEM Products at 15 Strathmore Road, Natick, Mass., 01760. The 2150A performs a compander function in combination with another circuit capable of controlling the compression. The 2150A requires other circuitry to achieve the expander function. The 2150A simply controls the feed signal into the integrator circuit 70.

The THD TRIM adjustment (total harmonic distortion), variable resistor 69 is used to trim the current values of two internal current sources within the U2 VCA 2150A. This adjustment is a factory adjustment which typically requires the use a harmonic distortion analyzer. By adjusting the THD TRIM, values of harmonic distortion as low as 0.02 have been obtained with the circuit of FIG. 3.

The circuitry from the filter input amplifier 64 to the output of the integrator 70 comprises a simple first order filter. The filter has a break frequency that is able to move and that is controlled by the control signal into pin 3 of the VCA 2150A 68. The break frequency is effectively controlled by the effective resistance of the voltage controlled amplifier 68 which operates to establish a controlled resistance between pins 1 and 8.

The filter circuit 60 is responsive to the control signal for automatically adjusting the bandwidth of the filter circuit to reduce the bandwidth of the filter circuit in response to reduced amplitude values of the control signal on signal line 76. The automatically adjustable bandwidth of filter circuit 60 is responsive to the control signal on signal line 76 from the absolute value circuit 100 for automatically reducing the bandwidth of the filter circuit in response to reduced values of the control signal to obtain the output signal at terminal 62. Output amplifier 78 buffers and scales the integrator output signal and provides the output signal at terminal 62.

Figure 4:
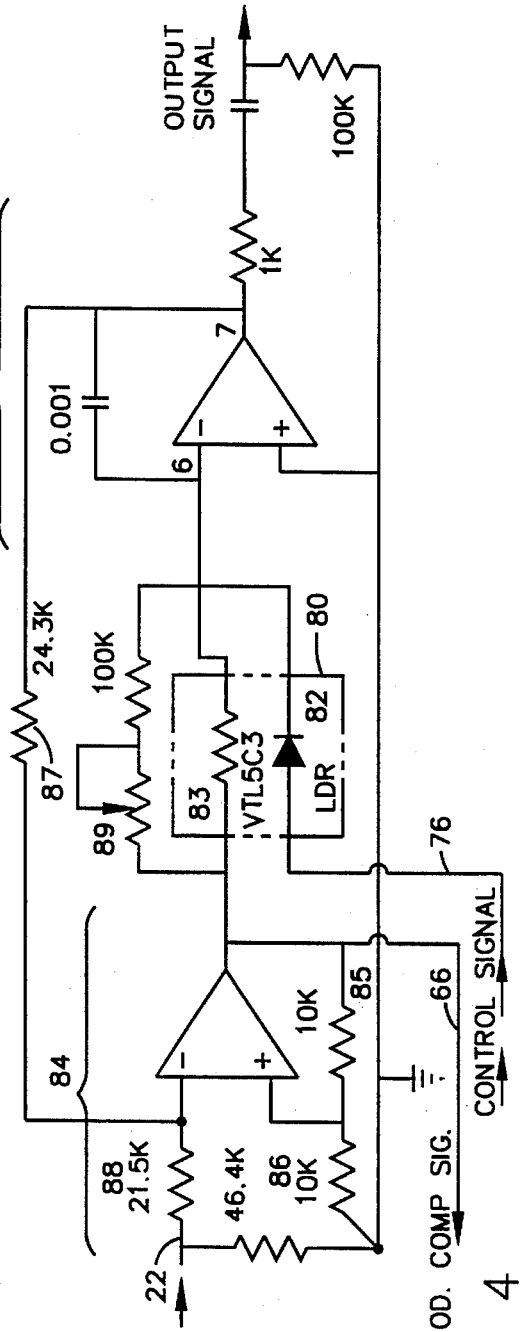
FIG. 4 is a schematic of an alternative embodiment of a single stage filter circuit using a photocell for ultra low noise and distortion; and, FIG. 5 is a schematic of an absolute value circuit for continuously monitoring the amplitude of the modified compensated signal to provide a control signal representative of the time dependent peak average value of modified compensated signal, to the filter circuit for continuous adjustment and control of the bandwidth of the filter circuit.

FIG. 4 show an alternative embodiment of the filter circuit 60 that substitutes a photocell 80 for the solid state voltage controlled amplifier 68 shown in FIG. 3. The alternative embodiment of FIG. 4 has the advantage of lower noise and distortion over the performance of the circuit of FIG. 3 but presently, at the cost of greater power required to drive the LED 82 and the larger volume of the photocell component 80.

In the embodiment of FIG. 4, the photocell 80 is a light dependent resistor 83 responsive to light from the LED 82. The LED is driven by current into its anode. The adjustable resistor 89 is an adjustment that is used in dual channel systems to balance the two channels because the photocells are not that well matched.

The overall gain is set to be approximately one by the ratio of feedback resistor 87 over input resistor 88. The gain through the non inverting first stage is approximately two. That gain is established by the ratio of (R86+R85)/R86. Some losses accrue to the integrator with the result that the overall gain is unity.

As current is increased through the diode, its brightness is increased which reduces the resistance of the photoresistor 83. The relationship between the current and resistance is not linear. The use of the photocell reduces the number of elements that the signal passes through thereby reducing the noise on the signal.

A complex solid state voltage controlled amplifier such as the 2150A has numerous diodes, and potentially non-linear components likely to increase the noise on the signal. Use of the photocell is believed to result in a 15–20 dB reduction in noise over that possible with a voltage controlled amplifier.

The function of the filter input amplifier 64 of FIG. 3 is performed by the filter input amplifier 84 of FIG. 4. Filter input amplifier 84 provides an added non-inverting feed back network of divider resistors 85 and 86 that provide a gain of +2 to the compensated signal at input terminal 22. The overall gain of the circuit of FIG. 4 is approximately unity as in the case of the circuit of FIG. 3, each being controlled by the ratio of a feed back resistor and an input resistor such as resistors 87 and 88 respectively. The break frequency of the integrator 70 is controlled by the value of its feedback capacitor and the equivalent resistance between the output of the filter input amplifier and pin 6 of the integrator amplifier 84.

In the case of the solid state voltage controlled amplifier 68 of FIG. 3, the device is specified to output a current into the virtual ground of pin 6 of the integrator amplifier. The current is a dependent variable of the current into pin 1 of the voltage controlled amplifier 68 and the control signal voltage on signal line 76. The current into pin 1 of the voltage controlled amplifier is a function of the output voltage V1 of the filter input amplifier 64 and resistor Rin 90. The net result would be expressed approximately as Iin=V1/Rin. Therefore V1=Rin*Iin. Also, the current out of the voltage controlled amplifier, Io=K1*Iin*V2 where V2 is the value of the control voltage and K1 is the gain of the voltage controlled amplifier. V1/Io is a ratio that is representative of a resistor between the output of the filter input amplifier 84 and the virtual ground of pin 6. Substituting Iin*Rin/K1*In*V2=Rin/K1*V2=(1/V2)*Rin/K1=the resistance between the output of the filter input amplifier and the input the integrator at pin 6. The relationship shows that the resistance is reduced by increasing values of control voltage V2 on signal line 76.

The photocell has a similar property in that increasing values of light from the LED 82 will reduce the value of the light sensitive or photosensitive resistor 83.

Figure 5:
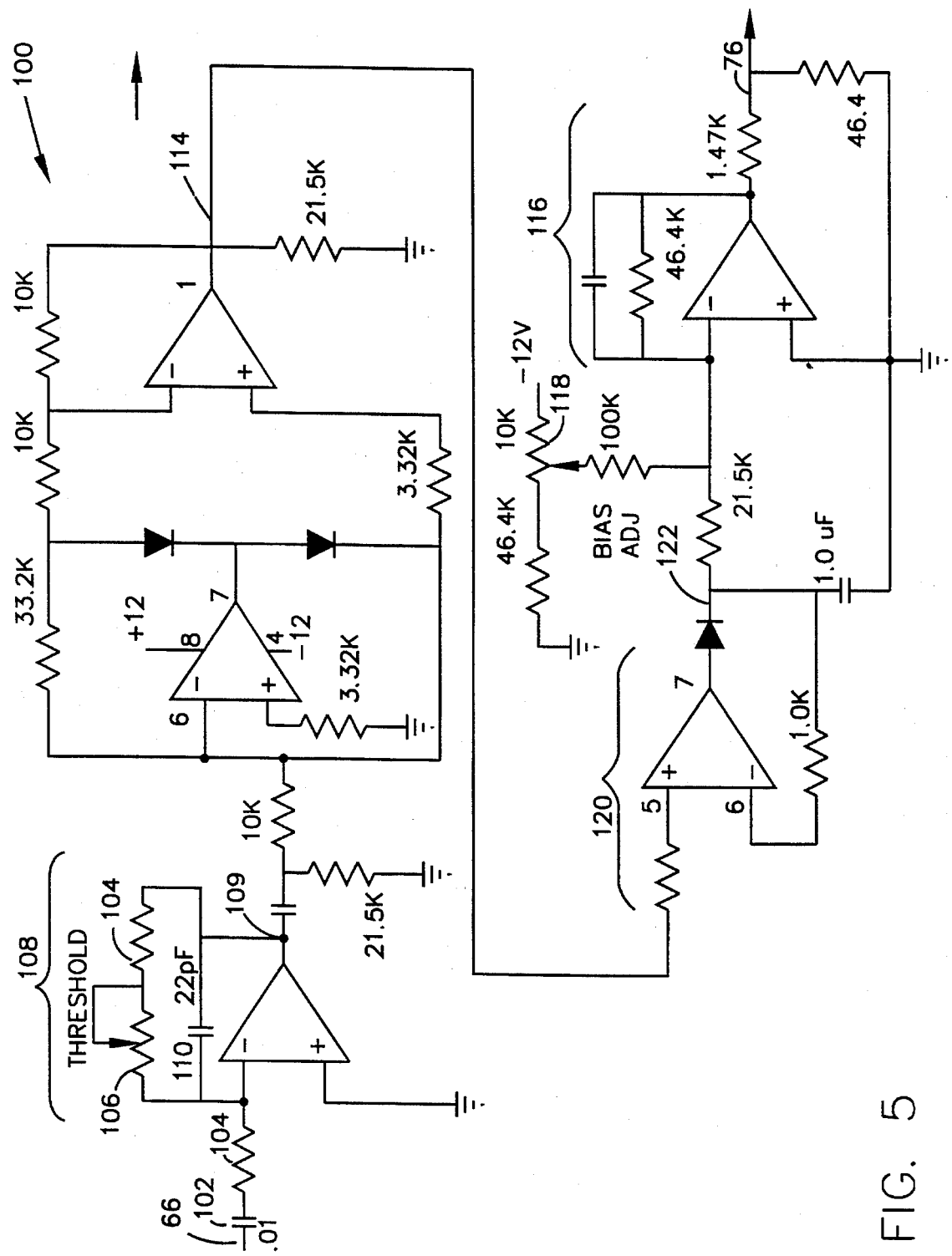

FIG. 5 shows the absolute value circuit 100 responsive to the modified compensated signal on signal line 66 for providing a control signal on signal line 76 that is proportional 76 to the amplitude of the modified compensated signal. The absolute value circuit 100 has an input dc isolation and lead network comprising capacitor 102 and resistor 104. Most of the filtering breakpoints, such as those established by capacitor 102 and resistor 104 combination were established by empirical experiments so as to find values that sounded best.

The THRESHOLD control, variable resistor 106 on the absolute value circuit input amplifier 108 is adjusted to accommodate an input signal that is low in amplitude and high in frequency. The absolute value circuit input amplifier is a high pass amplifier that is coupled to receive the modified compensated signal from signal line 66 and that provides a first amplified signal at its output terminal 109.

The THRESHOLD control adjustment of variable resistor 106 is a compromise that is made by the user to obtain the high frequency information along with some hiss or noise. The input capacitor 102 and resistor 104 are dominant for reducing the gain at low frequencies. At higher frequencies, a pole that is formed by the combination of resistor 104, variable resistor 106 and capacitor 110 introduce a break or pole that flattens the gain of the input amplifier to form a high pass amplifier with a gain controlled by variable resistor 106.

The input amplifier 108, as shown, has a potential gain of 25. The gain must be sufficient to permit the user to adjust the output of the peak detection circuit 120 at output terminal 122 up to a level that is acceptable.

The circuit from the output 109 of input amplifier 108 to the input of peak detector 120 comprises an absolute value circuit that is responsive to the first amplified signal at output 109 for providing an absolute value signal at the absolute value output terminal 114. The peak detection circuit 120, that follows the absolute value circuit, is responsive to the absolute value signal for providing a peaked absolute value signal.

Active filter 116 is a low-pass filter and bias circuit that is responsive to the peak absolute value signal at terminal 122 for providing the control signal to signal line 76. The active filter 116 is also a summing amplifier that allows adjustment of the BIAS ADJ via variable resistor 118 to bring the LED up to an initial brightness or to bring the voltage controlled amplifier into its active range. On a single channel version of the invention amplifier, the output of active filter 116 is adjusted to a reference point such that when an input signal into the system exceeds a predetermined amplitude level, the filter channel is wide open and the break point of the filter channel is moved out in frequency to its upper limit.

Variable resistor 118 is a dc bias adjustment control for adding a dc bias level to the control signal on signal line 76. The BIAS ADJ adjustment 118 permits the user to control where the filter moves and at what signal level it begins to move. If for example, you had 10 mV of 1000 cycle information as the compensated signal at terminal 22, the user, using the BIAS ADJ control can adjust the filter so that starting at 1000 cycles, and progressing upward in frequency, a 6 dB/octave roll off would be experienced.

If the signal were to increase from 10 mV to 40 mV, then the filter would open up and allow everything from around 20–20K Hz to pass through without being rolled off because the larger amplitude signal would cover or mask the low level noise that is present. Any noise that is in the system would not be audible because it would be masked by the higher level audio in the higher frequency range. As the signal level diminishes, the break frequency of the filter is reduced to attenuate the higher frequencies which is where hiss or noise is first detected by the user.

Accordingly there has been described an amplifier and control circuit. Although the invention has been disclosed and illustrated in detail, it is to be understood that the same is by way of illustration and example only and is not to be taken by way of limitation. The spirit and scope of this invention is to be limited only by the terms of the appended claims.

I claim:

1. An amplifier circuit comprising:

a pre-amplifier responsive to a program input signal having high, low and mid range frequency signal components for providing a compensated signal, the pre-amplifier having automatic gain control circuitry for balancing the high and mid range signal components;

a filter circuit coupled to receive the compensated signal, and a control signal and to provide a modified compensated signal, and an output signal, the filter circuit having an adjustable bandwidth, the filter circuit being responsive to the control signal for automatically adjusting the bandwidth of the filter circuit to reduce the bandwidth of the filter circuit in response to reduced amplitude values of the control signal;

an absolute value circuit responsive to the modified compensated signal for providing the control signal proportional to the amplitude of the modified compensated signal.

2. The amplifier circuit of claim 1 wherein the pre-amplifier further comprises:

a high frequency correction channel responsive to the program signal for providing a high frequency compensated signal;

a low frequency correction channel responsive to the program signal for providing a low frequency compensated signal;

a mid range channel responsive to the program signal for providing a mid range signal;

an automatic adjusting means for automatically adjusting the balance between the high frequency compensated signal and the mid range signal; and a summing circuit for adding the high frequency compensated signal, the low frequency compensated signal and the mid range signal to provide the compensated signal.

3. The amplifier circuit of claim 2 wherein the mid range channel further comprises an inverting amplifier.

4. The amplifier circuit of claim 1 wherein the absolute value circuit further comprises;

a high pass amplifier coupled to receive the modified compensated signal for providing an a first amplified signal;

an absolute value circuit responsive to the first amplified signal for providing an absolute value signal;

a peak detection circuit responsive to the absolute value signal for providing a peaked absolute value signal;

a low-pass filter and bias circuit responsive to the peak absolute value signal for providing the control signal.

5. The absolute value circuit of claim 4 wherein the high pass amplifier further comprises a gain adjustment.

6. The absolute value circuit of claim 4 wherein the low-pass filter and bias circuit further comprises a dc bias adjustment control for adding a dc bias level to the control signal.

7. The amplifier circuit of claim 1 wherein the filter circuit further comprises:

an input amplifier for summing the compensated signal and an integrator output signal to provide a modified compensated signal;

a voltage controlled amplifier having an input responsive to the modified compensated signal and the control voltage for providing an integrator input signal current;

an integrator circuit having an input coupled to receive the integrator input signal current and integrating the integrator input signal to provide an integrator output signal;

a low-pass active filter responsive to the integrator output signal for providing the output signal.

8. The filter circuit of claim 1 wherein the filter circuit further comprises:

an input amplifier for summing the compensated signal and an integrator output signal to provide a modified compensated signal;

a photocell comprising:

a photosensitive resistor and a light emitting diode, the photosensitive resistor being responsive to the light from the light emitting diode for further modifying the modified compensated signal to be an integrator input signal current and for coupling the integrator input signal current to an integrator input, and an integrator circuit having the integrator input coupled to receive the integrator input signal current and integrating the integrator input signal current to provide the integrator output signal;

a low-pass active filter responsive to the integrator output signal for providing the output signal.

9. An amplifier circuit comprising:

a pre-amplifier responsive to a program input signal for providing a compensated signal, a filter circuit coupled to receive and automatically filter the compensated signal to provide an output signal and a modified compensated signal, the filter circuit having an automatically adjustable bandwidth, the filter circuit being responsive to a control signal for automatically reducing the bandwidth of the filter circuit in response to reduced values of the control signal to obtain the output signal;

the filter circuit having, an input amplifier for summing the compensated signal and an integrator output signal to provide a modified compensated signal;

a photocell having;

a photosensitive resistor and a light emitting diode, the photosensitive resistor being responsive to the light from the light emitting diode for further modifying the modified compensated signal to be an integrator input signal and for coupling the integrator input signal to the integrator input; and a light emitting diode responsive to the control voltage for illuminating the light sensitive resistor, the resistance of the light sensitive resistor being increased in response to lower values of control voltage; and, an absolute value circuit responsive to the modified compensated signal for providing a control signal proportional to the amplitude of the modified compensated signal.

10. The amplifier circuit of claim 9 wherein the pre-amplifier further comprises:

a high frequency correction channel responsive to the program signal for providing a high frequency compensated signal;

a low frequency correction channel responsive to the program signal for providing a low frequency compensated signal;

a mid range channel responsive to the program signal for providing a mid range signal;

an automatic adjusting means for automatically adjusting the balance between the high frequency compensated signal and the mid range signal; and a summing circuit for adding the high frequency compensated signal, the low frequency compensated signal and the mid range signal to provide the compensated signal.

11. The amplifier circuit of claim 10 wherein the mid range channel further comprises an inverting amplifier.

12. The amplifier circuit of claim 10 wherein the absolute value circuit further comprises;

a high pass amplifier coupled to receive the modified compensated signal for providing an a first amplified signal;

an absolute value circuit responsive to the first amplified signal for providing an absolute value signal;

a peak detection circuit responsive to the absolute value signal for providing a peaked absolute value signal;

a low-pass filter and bias circuit responsive to the peak absolute value signal for providing the control signal.

13. The absolute value circuit of claim 12 wherein the high pass amplifier further comprises a gain adjustment.

14. The absolute value circuit of claim 12 wherein the low-pass filter and bias circuit further comprises a dc bias adjustment control for adding a dc bias level to the control signal.

15. An amplifier circuit comprising:

a pre-amplifier responsive to a program input signal having high, low and mid range frequency signal components for providing a compensated signal, the pre-amplifier having automatic gain control circuitry for balancing the high and mid range signal components;

a filter circuit coupled to receive the compensated signal, and a control signal and to provide a modified compensated signal, and an output signal, the filter circuit having an adjustable bandwidth, the filter circuit further comprising:

an input amplifier for summing the compensated signal and an integrator output signal to provide a modified compensated signal;

a voltage controlled amplifier having an input responsive to the modified compensated signal and the control voltage for providing an integrator input signal current;

an integrator circuit having an input coupled to receive the integrator input signal current and integrating the integrator input signal to provide an integrator output signal;

an absolute value circuit responsive to the modified compensated signal for providing a control signal proportional to the amplitude of the modified compensated signal.

* * * * *